(12) United States Patent
Furuta et al.

(10) Patent No.: US 7,276,956 B2
(45) Date of Patent: Oct. 2, 2007

(54) INTEGRATED CIRCUIT APPARATUS CONTROLLING SOURCE VOLTAGE OF MOSFET BASED ON TEMPERATURE

(75) Inventors: Hiroshi Furuta, Kanagawa (JP); Kenjyu Shimogawa, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 21 days.

(21) Appl. No.: 11/157,832

(22) Filed: Jun. 22, 2005

(65) Prior Publication Data

US 2005/0285662 A1      Dec. 29, 2005

(30) Foreign Application Priority Data

Jun. 23, 2004   (JP)   .............................. 2004-184944

(51) Int. Cl.
*G05F 1/10*   (2006.01)
(52) U.S. Cl. ........................ 327/534; 327/513
(58) Field of Classification Search ................ 327/512, 327/513, 534
See application file for complete search history.

(56) References Cited

U.S. PATENT DOCUMENTS

| | | | |
|---|---|---|---|
| 5,614,847 A | | 3/1997 | Kawahara et al. |
| 6,107,836 A | | 8/2000 | Kawahara et al. |
| 6,175,251 B1 | * | 1/2001 | Horiguchi et al. ............. 326/83 |
| 6,404,239 B1 | | 6/2002 | Kawahara et al. |
| 6,707,745 B2 | | 3/2004 | Mizugaki |
| 6,839,299 B1 | * | 1/2005 | Bhavnagarwala et al. .. 365/226 |
| 6,982,915 B2 | * | 1/2006 | Houston et al. ............. 365/211 |
| 7,123,076 B2 | * | 10/2006 | Hatakeyama et al. ....... 327/534 |

FOREIGN PATENT DOCUMENTS

| | | |
|---|---|---|
| JP | 06-314491 | 11/1994 |
| JP | 07-086916 | 3/1995 |
| JP | 2003-100074 | 4/2003 |

OTHER PUBLICATIONS

Kuroda et al., "A 0.9-V, 150 MHz, 10-mW, 4mm$^2$, 2-D Discrete Cosine Transform Core Processor with Variable Threshold-Voltage (VT) Scheme," IEEE Journal of Solid-State Circuits, vo. 31, No. 11, Nov. 1996, pp. 1770-1779.
Mutoh et al., "1-V Power Supply Hight-Speed Digital Circuit Technology with Multithreshold-Voltage CMOS," IEEE Journal of Solid-State Circuits, vol. 30, No. 8, Aug. 1995, pp. 847-854.
Osada, "16.7-fA/Cell Tunnel-Leakage-Suppressed 16-Mb SRAM for Handling Cosmic-Ray-Induced Multierrors," IEEE Journal of Solid-State Circuits, vol. 38, No. 11, Nov. 2003, pp. 1952-1957.
Yamaoka et al., "A 300MHz 25μA/Mb Leakage On-Chip SRAM Module Featuring Process-Variation Immunity and Low-Leakage-Active Mode for Mobile-Phone Application Processor," 2004 IEEE International Solid State Circuits Conference, Feb. 2004, 2 pages.

* cited by examiner

*Primary Examiner*—Jeffrey Zweizig
(74) *Attorney, Agent, or Firm*—Foley & Lardner LLP

(57) ABSTRACT

An integrated circuit apparatus according to one embodiment of the invention has an NMOS transistor and a source voltage controller which controls the source voltage of the NMOS transistor according to operation mode. The source voltage controller changes the source voltage according to temperature. Since this integrated circuit apparatus changes the source voltage of the MOSFET based on temperature, it is controlled to have desired leakage current regardless of temperature change.

28 Claims, 11 Drawing Sheets

INTEGRATED CIRCUIT APPARATUS CONTROLLING SOURCE VOLTAGE OF MOSFET BASED ON TEMPERATURE

BACKGROUND OF THE INVENTION

1. Field of the Invention

The present invention relates to an integrated circuit apparatus and a method for designing the same and, particularly, to an integrated circuit apparatus which changes the source voltage of MOSFET and a method for designing the same.

2. Description of Related Art

Recently, small semiconductor integrated circuit apparatus such as metal-oxide-semiconductor large-scale integrated circuits (MOSLSIs) have been developed, and semiconductor integrated circuit apparatus fabricated with 90 nm process technology have come into practical use. In addition to miniaturization, higher speed operation and lower power consumption are required for semiconductor integrated circuit apparatus.

While power supply voltage is reduced for lower power consumption to achieve miniaturization of MOSLSI, increase in integration density and access speed causes higher power consumption. Conventional LSIs are designed so that standby current/voltage is lower than active current/voltage in order to save power consumption. However, as the size reduction progresses, not only the active current/voltage but also the standby current/voltage has become critical. This is mainly due to increase in subthreshold leakage current and leakage current caused by reduction in insulating film thickness for miniaturization, which occurs because the operating voltage of MOSFET (which is referred to also as a MOS transistor) is reduced to about 1V for miniaturization and the threshold voltage of the MOS transistor is further reduced to about 0.2V for higher-speed operation.

As technology for reducing standby current, Multithreshold-Voltage CMOS (MTCMOS) and Variable Threshold-Voltage CMOS (VTCMOS) in normal logic circuits are known, as described in Shin'ichiro Mutoh et al., 1-V Power Supply High-Speed Digital Circuit Technology with Multi-threshold-Voltage CMOS, IEEE JOURNAL OF SOLID-STATE CIRCUITS, Vol. 30, No. 8, August 1995 pp. 847-854, and in Tadahiro Kuroda et al., A 0.9-V, 150-MHz, 10-mW, 4 mm$^2$, 2-D Discrete Cosine Transform Core Processor with Variable Threshold-Voltage (VT) Scheme, IEEE JOURNAL OF SOLID-STATE CIRCUITS, Vol. 31, No. 11, November 1996, pp. 1770-1779. The MTCMOS technology taught by Mutoh et al. places a MOS transistor between virtual power supplies and switches the source voltage of the MOS transistor between active and standby. Changing the source voltage in the standby state allows reduction in leakage current. The VTCMOS technology taught by Kuroda et al. also switches the source voltage effectively by changing substrate potential.

Further, technology which controls the source voltage of a MOS transistor just like the MTCMOS technology is described in Japanese Unexamined Patent Publication No. 07-86916 (Takayuki Kawahara et al.). This technology controls the source voltage by placing a parallel circuit of "resistor" and "switch" between the source and a reference voltage line (substrate potential of MOSFET). The "resistor" turns on a given MOSFET and the "switch" turns on/off the MOSFET. Kawahara et al. also teaches a mechanism for reducing leakage current when changing the source voltage from reference voltage (substrate potential or well potential).

Examples of reducing standby current of a memory cell, not a normal logic circuit, are described in Kenichi Osada et al., 16.7-fA/Cell Tunnel-Leakage-Suppressed 16-Mb SRAM for Handling Cosmic-Ray-Induced Multierrors, IEEE JOURNAL OF SOLID-STATE CIRCUITS, Vol. 38, No. 11, November 2003, pp. 1952-1957, and Masanao Yamaoka et al., A 300 MHz 25 μA/Mb Leakage On-Chip SRAM Module Featuring Process-Variation Immunity and Low-Leakage-Active Mode for Mobile-Phone Application Processor, IEEE International Solid-State Circuits Conference, 542, 2004, pp. 494-495. Osada et al. and Yamaoka et al. teach technology which reduces standby current of SRAM by making the source voltage of a memory cell driver transistor slightly higher than GND potential and reducing the bit line voltage of a transfer transistor. Osada et al. show leakage current components such as gate tunnel leakage current, gate-induced drain leakage (GIDL) current, and subthreshold leakage current, and leakage current at normal temperature (25° C.) and high temperature (90° C.), and describes that the leakage current significantly increases at high temperature. Osada et al. also describe the configuration which controls the source voltage of each SRAM cell. Yamaoka et al. reduce the current of entire SRAM by controlling the source voltage of an NMOS transistor.

The standby current of MOSLSI typically increases at high temperature due to temperature dependence of the subthreshold characteristics of MOSFET. In order to satisfy the required specification of products, maximum leakage current, which is presently at high temperature, should satisfy the specification. Though Osada et al. schematically show standby current at normal temperature and high temperature, they describe nothing about device temperature and temperature dependence of a circuit (FIG. 9) which controls the source voltage of a MOS transistor constituting a memory cell.

As a way of preventing standby voltage from increasing significantly at high temperature, a technique for reducing power supply voltage at high temperature is described in Japanese Unexamined Patent Publication No. 06-314491 (Hiroshi Sato). However, nothing is disclosed about the relationship between specific source voltage and temperature.

A technique which controls a refresh time (timer period) of a DRAM cell according to temperature is described in Japanese Unexamined Patent Publication No. 2003-100074 (Koichi Mizugaki). This technique keeps the same refresh time (timer period) as at normal temperature up to a given temperature and reduces the refresh time (timer period) after exceeding the given temperature with a plurality of temperature detection circuits and control circuits by using the temperature characteristics of PN junction. This technique reduces power consumption by changing the refresh time (timer period), which has been set to satisfy the refresh characteristics at high temperature in conventional techniques, according to temperature.

Osada et al. reduce standby current by making the source voltage of a memory cell driver transistor 0.5V higher than GND potential (substrate potential of MOS transistor) However, this technique always takes time to set the source voltage from boost state by 0.5V back to GND level when shifting from standby state to active state. Osada et al. actually describe that several ns of delay occurs as shown in FIG. 10. Each of the above-mentioned conventional techniques for controlling the source voltage switches the source voltage between given binary voltage values.

Setting the source voltage of a MOS transistor to be higher (or lower in the case of a PMOS transistor) than substrate potential requires reduction in ON-current. It is therefore necessary to set the source voltage to be the same as the substrate potential during active operation and particularly in high-speed operation. This has a problem that, if a difference between the source voltage and the substrate potential is large, it requires large energy and takes a longer time to set the source voltage back to the same level as the substrate potential, causing operation (access) delay to occur.

SUMMARY OF THE INVENTION

According to one aspect of the present invention, there is provided an integrated circuit apparatus which includes a MOSFET and a source voltage controller controlling source voltage of the MOSFET according to operation mode of the MOSFET, wherein the source voltage controller changes the source voltage based on temperature. Since this integrated circuit apparatus changes the source voltage of the MOSFET based on temperature, it is controlled to have desired leakage current regardless of temperature change and the control is performed using optimal source voltage. The control is thus performed not with constant source voltage but with necessary source voltage for each temperature, thereby reducing power consumption during standby mode and increasing operation speed when switching from standby mode to active mode.

According to another aspect of the present invention, there is provided a method of designing an integrated circuit apparatus having a MOSFET and a source voltage controller controlling source voltage of the MOSFET according to temperature. The method includes measuring characteristics of leakage current of the MOSFET with respect to temperature, measuring characteristics of leakage current of the MOSFET with respect to source voltage of the MOSFET, and determining source voltage to be controlled by the source voltage controller based on the measured characteristics of leakage current of the MOSFET with respect to temperature and the measured characteristics of leakage current of the MOSFET with respect to source voltage. This design method of integrated circuit apparatus effectively determines the source voltage to be controlled so as to obtain desired leakage current according to temperature. This method therefore allows performing control not with constant source voltage but with necessary source voltage for each temperature, thereby reducing power consumption during standby mode and increasing operation speed when switching from standby mode to active mode.

The present invention provides an integrated circuit apparatus capable of reducing power consumption and allowing high-speed operation.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described hereinbelow with reference to illustrative embodiments. The explanation provided hereinbelow merely illustrates the embodiments of the present invention, and the present invention is not limited to the below-described embodiments. The description hereinbelow is appropriately shortened and simplified to clarify the explanation. A person skilled in the art will be able to easily change, add, or modify various elements of the below-described embodiments, without departing from the scope of the present invention. In the figures, the identical reference symbols denote identical structural elements and the redundant explanation thereof is omitted.

First Embodiment

The configuration of an integrated circuit apparatus according to a first embodiment of the invention is described hereinafter with reference to FIG. 1. The integrated circuit apparatus has source voltage controllers 101 to 10*n* (one of the source voltage controllers 101 to 10*n* is referred to hereinafter also as source voltage controller 101) and internal circuit blocks 201 to 20*n* (one of the internal circuit blocks 201 to 20*n* is referred to hereinafter also as internal circuit block 201). The source voltage controllers 101 to 10*n* and the internal circuit blocks 201 to 20*n* are connected by source voltage lines 4.

Figure 1:
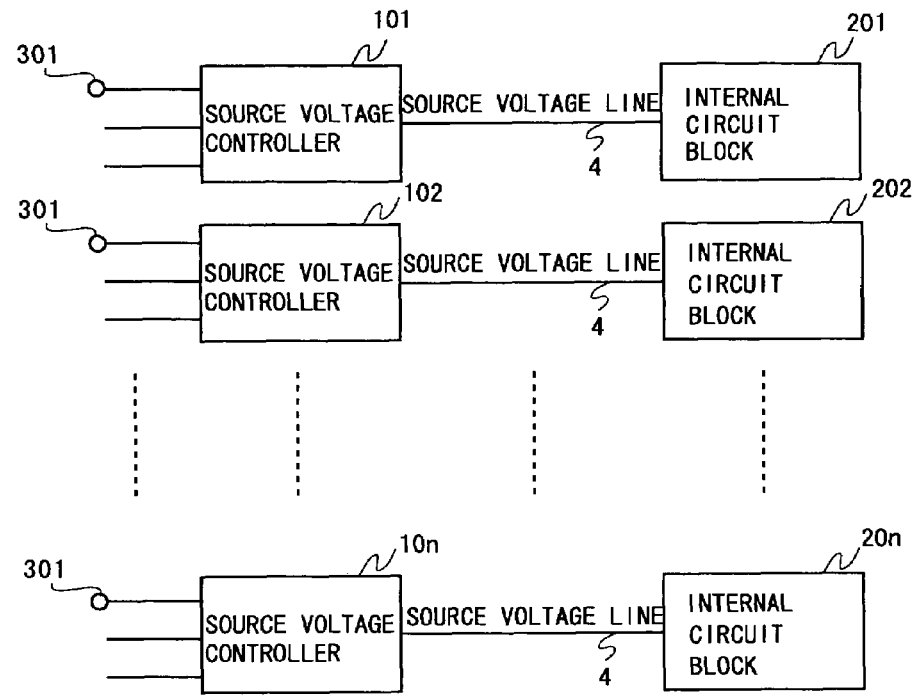
FIG. 1 is a block diagram of an integrated circuit apparatus of the present invention.

Although the source voltage controllers 101 to 10*n* and the internal circuit blocks 201 to 20*n* are connected one to one by the source voltage lines 4 in the example of FIG. 1, they may be connected one to many. For example, one source voltage controller 101 may be connected to a plurality of internal circuit blocks 201. Further, though the integrated circuit apparatus of this example has n-number of source voltage controllers 101 to 10*n* and *n*-number of internal circuit blocks 201 to 20*n*, it may have an arbitrary number of source voltage controllers 101 and an arbitrary number of internal circuit blocks 201.

The source voltage controllers 101 to 10n control the source voltage to be supplied to the internal circuit blocks 201 to 20n. The source voltage controller 101, for example, switches the source voltage to output for each operation action or operation mode, such as active and standby, of the integrated circuit apparatus or the internal circuit block 201. For example, the source voltage controller 101 outputs the source voltage at a reference voltage level during active mode while outputting the source voltage according to a temperature change during standby mode.

Each of the source voltage controllers 101 to 10n individually receives a command signal indicating active or standby from each command input terminal 301 and thereby switches the source voltage. The input command signal may be a memory read/write command signal, an address signal or the like and the source voltage may be switched according to these command signals. The source voltage output from the source voltage controllers 101 to 10n during standby mode may be different from each other, and each voltage is preferably suitable for each of the internal circuit blocks 201 to 20n. As described later, the source voltage is determined by the characteristics of MOS transistors of the internal circuit blocks 201 to 20n. The command input to the command input terminal 301 and the source voltage output from the source voltage controller 101 may be controlled by other control circuits.

Each of the internal circuit blocks 201 to 20n has a function independent of each other and they may be cells, macros, and so on. In the internal circuit blocks 201 to 20n, leakage current of MOS transistor is reduced by the source voltage supplied from the source voltage controllers 101 to 10n.

The configuration of the internal circuit block according to this embodiment is described hereinafter with reference to FIG. 2A. The internal circuit block 201 has inverters INV21 and INV22. The inverters INV21 and INV22 are CMOS inverters. The inverter INV21 has a PMOS transistor P21 and an NMOS transistor N21, and the inverter INV22 has a PMOS transistor P22 and an NMOS transistor N22.

The inverters INV21 and INV22 can be used for various circuits. For example, the NMOS transistors N21 and N22 may be used as driver devices of memory cells such as SRAM cells.

Figure 2A:
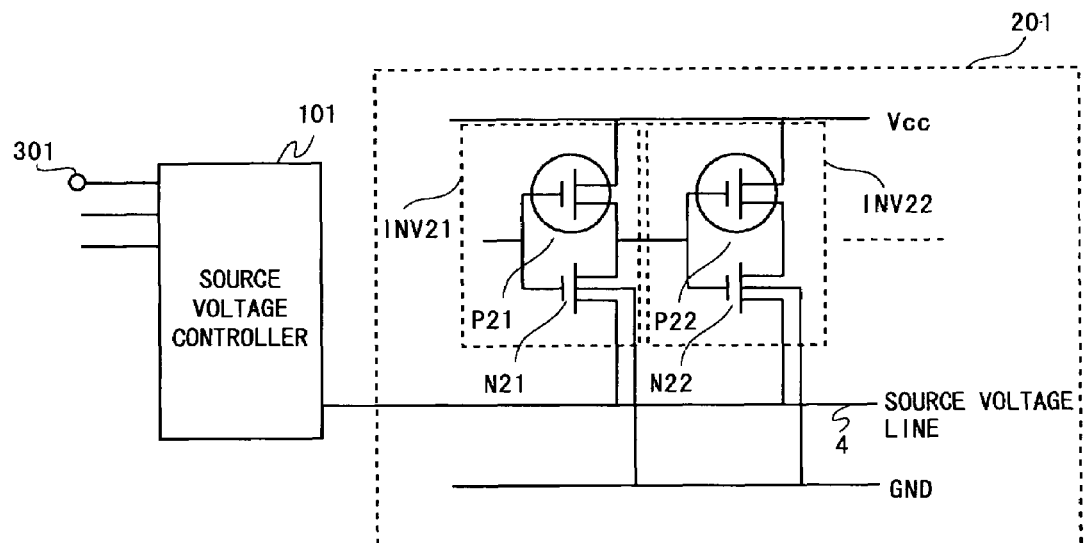
FIG. 2A is a block diagram of an internal circuit block of the present invention.

Though the internal circuit block 201 has two inverters in the example of FIG. 2A, it may have an arbitrary number of inverters depending on circuit configuration. Further, the internal circuit block 201 may have a PMOS transistor, an NMOS transistor, or other devices which do not constitute an inverter and connect a source voltage line to each of the PMOS transistor and the NMOS transistor not constituting an inverter.

The gates of the PMOS transistor P21 and the NMOS transistor N21 are connected to each other and a connection node serves as an input terminal. Their drains are also connected to each other and a connection node serves as an output terminal. The source of the PMOS transistor P21 is connected to a power supply Vcc. The source of the NMOS transistor N21 is connected to the source voltage line 4 and the substrate terminal is connected to GND. Similarly, the PMOS transistor P22 and the NMOS transistor N22 are connected together, and the PMOS transistor P22 is connected to the power supply Vcc, and the NMOS transistor N22 is connected to the source voltage line 4 and GND. In the NMOS transistors N21 and N22, leakage current varies by the voltage supplied form the source voltage line 4. The GND potential is the potential of a substrate or a well where the NMOS transistor is placed.

Figure 2B:
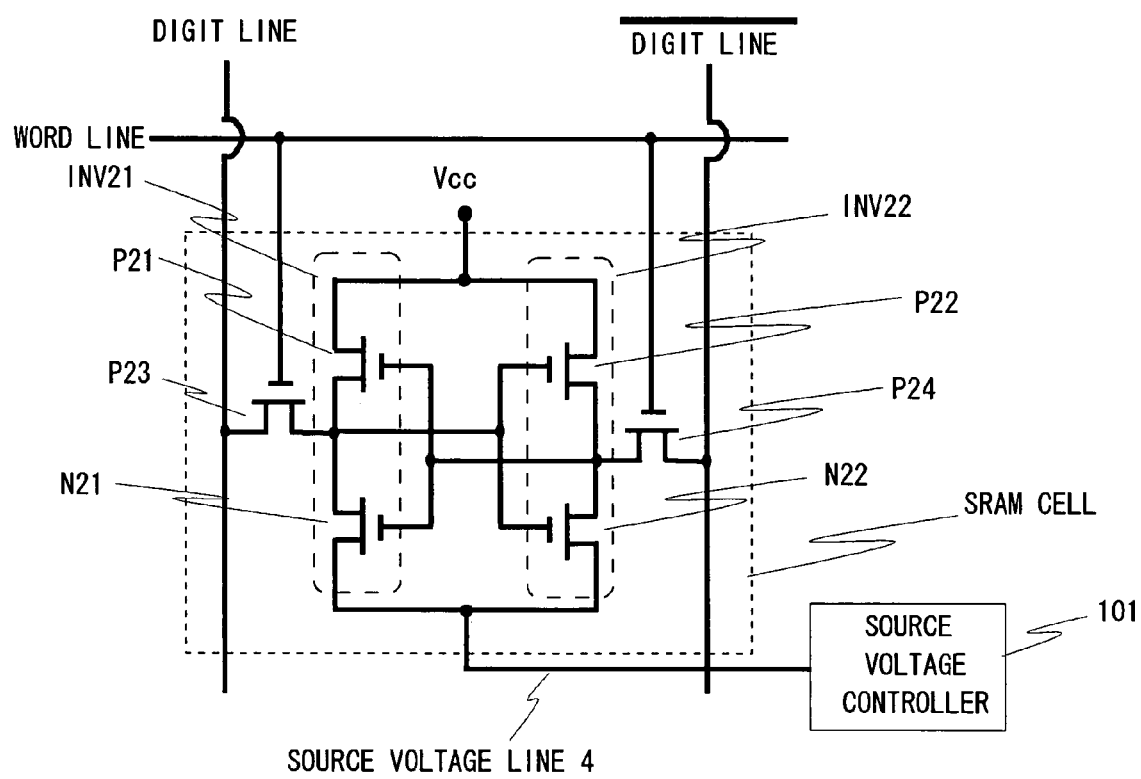
FIG. 2B is a circuit diagram showing the configuration of a SRAM cell of the present invention.

FIG. 2B is a circuit diagram showing the configuration of a SRAM cell application of the inverters INV21 and INV22. In the SRAM cell, the NMOS transistors N21 and N22 are drive transistors, the PMOS transistors P21 and P22 are load transistors, and the PMOS transistors P23 and P24 are transfer transistors.

The gates of the PMOS transistor P21 and the NMOS transistor N21 are connected to a connection node of the PMOS transistor P22 and the NMOS transistor N22. The gates of the PMOS transistor P22 and the NMOS transistor N22 are connected to a connection node of the PMOS transistor P21 and the NMOS transistor N21. The PMOS transistor P23 is connected between a digit line and a connection node of the PMOS transistor P21 and the NMOS transistor N21. The PMOS transistor P24 is connected between a digit line used for an inverted signal and a connection node of the PMOS transistor P22 and the NMOS transistor N22. The gates of the PMOS transistors P23 and P24 are connected to a word line. The sources of the PMOS transistors P21 and P22 are connected to a power supply Vcc. The sources of the NMOS transistors N21 and N22 are connected to a source voltage line.

Figure 3:
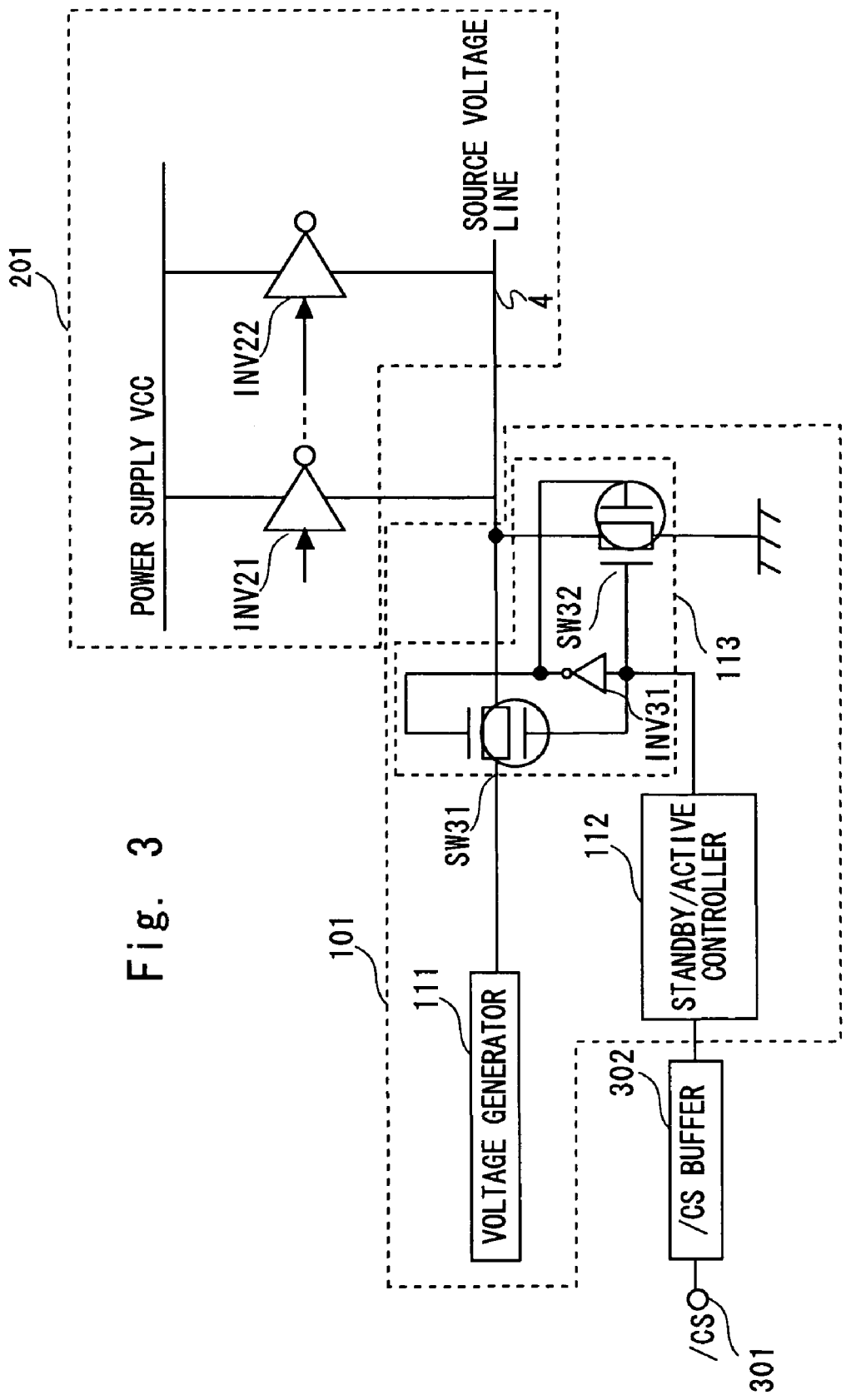
FIG. 3 is a block diagram of a source voltage controller of the present invention.

The configuration of the source voltage controller according to this embodiment is described hereinafter with reference to FIG. 3. In FIG. 3, the inverters INV21 and INV22 of the internal circuit block 201 are the same circuits as in FIG. 2A.

The source voltage controller 101 has a voltage generator 111, a standby/active controller 112, and a transfer circuit 113. The voltage generator 111 outputs source voltage according to temperature. Its circuit configuration is detailed later.

The standby/active controller 112 controls switching between standby and active. The standby/active controller 112 is connected to the command input terminal 301 through a chip selector (CS) buffer 302. The command input terminal 301 is a CS terminal, for example. The standby/active controller 112 may be directly connected to the command input terminal 301 without placing the CS buffer 302.

The standby/active controller 112 outputs a source voltage switching signal to the transfer circuit 113 in accordance with the command signal from the command input terminal 301.

The transfer circuit 113 switches the source voltage to be supplied to the inverters INV21 and INV22 of the internal circuit block 201. The transfer circuit 113 has switches SW31 and SW32 and an inverter INV31.

The switches SW31 and SW32 are transfer gates, for example, and each has a PMOS transistor and an NMOS transistor. The PMOS and NMOS transistors of the switch SW31 or SW32 are turned on/off at the same time by the inverter INV31, so that the switches SW31 and SW32 operate as switches. One of the switches SW31 and SW32 is in the on state and the other one is in the off state in any modes such as active and standby. If the switch SW31 is on, the voltage generator 111 is connected to the source voltage line 4; if the switch SW32 is on, the source voltage line 4 is connected to GND.

For example, if the operation mode is standby, a high-level signal is input to the standby/active controller 112 from the command input terminal 301 through the CS buffer 302. Receiving the high-level signal, the standby/active controller 112 outputs a low-level signal to the transfer circuit 113. Receiving the low-level signal, the inverter INV31 of the transfer circuit 113 outputs a high-level signal. Then, a low-level signal is input to the PMOS transistor of the switch SW31, and a high-level signal is input to the NMOS transistor of the switch SW31, thereby turning on the switch SW31. Further, a low-level signal is input to the NMOS transistor of the switch SW32, and a high-level signal is input to the PMOS transistor of the switch SW32, thereby turning off the switch SW32.

Thus, during the standby mode, the voltage output from the voltage generator 111 becomes the source voltage of the NMOS transistors N21 and N22 of the inverters INV21 and INV22 through the source voltage line 4.

On the other hand, if the operation mode is active, a low-level signal is input to the standby/active controller 112 from the command input terminal 301 through the CS buffer 302. Receiving the low-level signal, the standby/active controller 112 outputs a high-level signal to the transfer circuit 113.

Receiving the high-level signal, the inverter INV31 of the transfer circuit 113 outputs a low-level signal. Then, a high-level signal is input to the PMOS transistor of the switch SW31, and a low-level signal is input to the NMOS transistor of the switch SW31, thereby turning off the switch SW31. Further, a high-level signal is input to the NMOS transistor of the switch SW32, and a low-level signal is input to the PMOS transistor of the switch SW32, thereby turning on the switch SW32.

Thus, during the active mode, the GND potential becomes the source voltage of the NMOS transistors N21 and N22 of the inverters INV21 and INV22 through the source voltage line 4. In this way, this embodiment reduces leakage current during the standby mode so as to lower power consumption while setting the source voltage as a reference voltage during the active mode so as to allow high-speed operation.

The source voltage generated by the source voltage controller of this embodiment is described hereinafter with reference to FIGS. 4 to 6. This embodiment supplies the source voltage according to temperature to MOS transistors. The temperature dependence of leakage current of a MOS transistor is described below. The leakage current of a MOS transistor includes the following components (a) to (d). These leakage components are described in Osada et al.

(a) Channel leakage current when a MOS transistor is in the off state, which is called subthreshold leakage (b) Drain-to-substrate junction leakage (c) Gate-induced drain leakage (GIDL), which is drain-to-substrate leakage due to gate-to-drain electric field, also called band-to-band (BTB) tunneling leakage (d) gate-to-drain/source or gate-to-substrate tunneling leakage, which is also called gate tunneling leakage The components (c) and (d) are less temperature dependent than the subthreshold leakage (a). The components (a) and (b) are highly temperature dependent. In the present devices, the component (a) is dominant under high temperature, and the component (b) is negligibly low compared to the component (a).

On the other hand, the above leakage components have different degrees depending on device configuration. For example, if a gate insulating film is thin, the components (c) and (d) increase. As for the highly temperature dependent leakage current components (a) and (b), in the MOS transistor with the present 0.1 µm rule whose power supply voltage is about 1V and threshold voltage is as low as about 0.2V, the subthreshold leakage (a) is dominant.

The temperature dependence of the subthreshold characteristics is described hereinafter. FIG. 4 is a graph showing the temperature dependence of drain current (Id-T characteristics) in an NMOS transistor. Though the NMOS transistor is mainly described in the following description, it is the same for a PMOS transistor as well.

Figure 4:
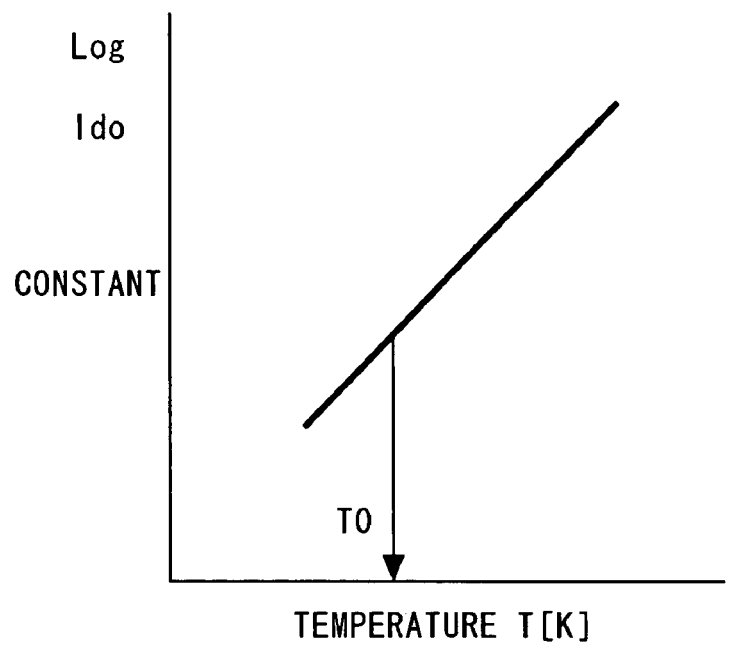
FIG. 4 is a graph showing the characteristics of a MOS transistor of the present invention.

In the graph of FIG. 4, the horizontal axis shows temperature T and the vertical axis shows drain current Id0. The temperature T is measured by Kelvin (K) and the drain current Id0 is represented by log. The drain current Id0 is measured at each temperature under the conditions that drain voltage is constant and gate voltage Vg=0V. T0 in the graph of FIG. 4 indicates normal temperature, for example. The graph shows that the following formula is given when the drain current Id0 under Vg=0V is expressed as a function of temperature.

$$Id0 = \alpha * \exp(\beta * T) \qquad \text{Formula 1:}$$

In Formula 1, α and β are positive constants determined by device configuration, which are measured by Ampere (A) and 1/K, respectively. The drain current Id0 therefore changes exponentially as temperature T changes. Further, gate tunneling leakage current, which is gate current under gate voltage Vg=0V, is expressed by the following formula in a simple model.

$$Ig = A * \exp(-\beta * Tox) \qquad \text{Formula 2:}$$

In Formula 2, A and B are constants determined by device configuration, and Tox is the thickness of a gate insulating film. As shown by Formula 2, a simple model of gate tunneling leakage has no temperature term and the temperature dependence is negligible.

Figure 5:
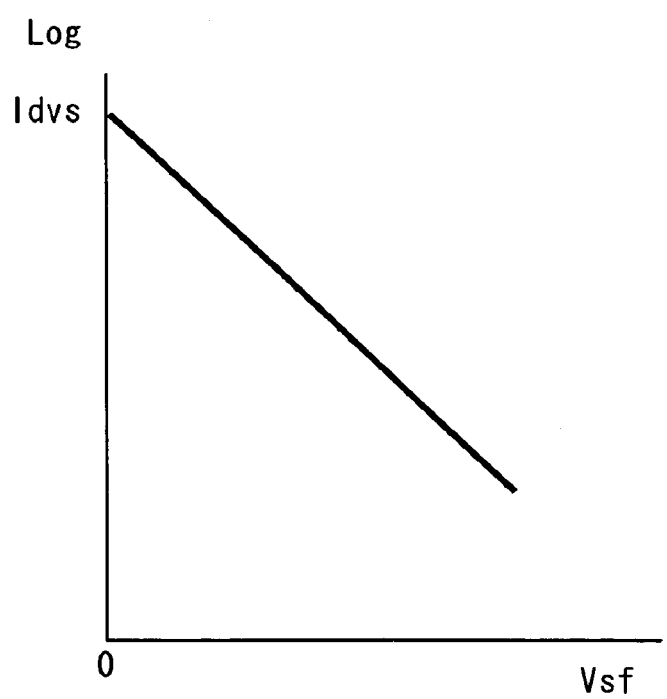
FIG. 5 is a graph showing the characteristics of a MOS transistor of the present invention.

FIG. 5 is a graph showing a relationship between drain current and source voltage (Id-Vsf characteristics) in a MOS transistor. In a CMOS circuit, the substrate potential is 0V in an NMOS transistor and Vcc in a PMOS transistor. In the graph of FIG. 5, the horizontal axis shows voltage difference Vsf between source voltage and substrate or well potential, and the vertical axis shows drain current Idvs. As in FIG. 4, the drain current Idvs is represented by log and measured at each Vsf under the conditions that the drain voltage is constant and the gate voltage Vg=0V. Vsf is measured by Volt (V). The value of Vsf is higher than substrate potential in NMOS transistors and lower than substrate potential in PMOS transistors. The graph of FIG. 5 shows that the following formula is given when the drain current Idvs under Vg=0V is expressed as a function of Vsf.

$$Idvs = \gamma * \exp(-\delta * Vsf) \qquad \text{Formula 3:}$$

In Formula 3, γ and δ are positive constants determined by device configuration, which are measured by Ampere (A) and 1/V, respectively. The drain current Idvs therefore changes exponentially as the source voltage changes. A change in the drain current when the source voltage changes is taught by Kawahara et al.

A designer can find the drain current (leakage current) at a given temperature when the source voltage is changed arbitrarily by obtaining the relationship in the graphs of FIGS. 4 and 5 with Test Element Group (TEG) or the like. For example, a designer may design an integrated circuit apparatus by the following steps. First, the characteristics of temperature-drain current (leakage current) shown in the graph of FIG. 4 are measured with TEG or the like. Then, the characteristics of source voltage-drain current (leakage current) shown in the graph of FIG. 5 are measured with TEG or the like. After that, the characteristics of source voltage with respect to temperature are obtained from the characteristics of drain current-temperature (leakage current) and the characteristics of drain current (leakage current)-source voltage, thereby determining the source voltage to be controlled by the voltage generator 111. The integrated circuit apparatus where desired leakage current occurs at desired temperature is thereby designed.

Figure 6:
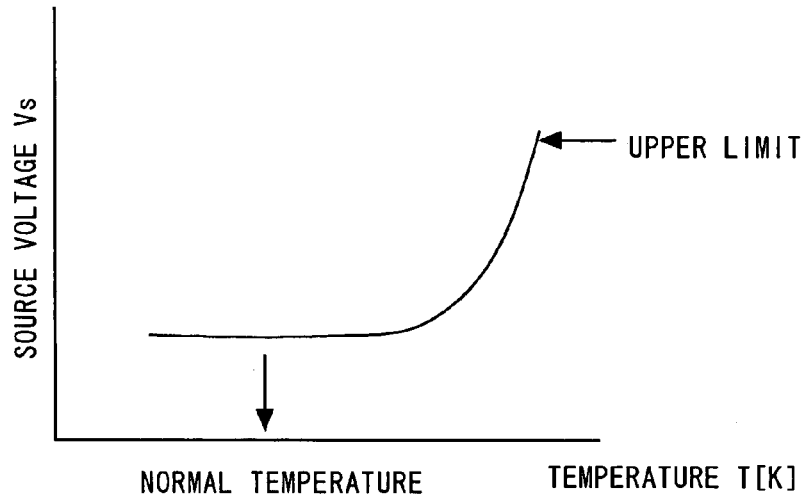
FIG. 6 is a graph showing the characteristics of a MOS transistor of the present invention.

FIG. 6 is a graph showing the characteristics of temperature and source voltage (Vs-T characteristics). The characteristics shown in FIG. 6 are the output characteristics of the source voltage controller. In the graph of FIG. 6, the horizontal axis shows temperature T and the vertical axis shows source voltage Vs. The temperature T is measured by Kelvin (K) and the source voltage Vs is measured by Volt (V). The source voltage Vs can be obtained as the one when the drain current at each temperature in FIG. 4 and Formula 1 is the drain current in FIG. 5 and Formula 3. The source voltage Vs is preferably within the range from a substrate potential or well potential to a predetermined upper limit. It is also preferred that the source voltage Vs is constant when temperature is a predetermined value or lower and changes exponentially when the temperature is over the predetermined value.

Then, the relationship between tunneling current and subthreshold current which are less temperature dependent as described above is described below. Since a gate insulating film is thin in the present devices, the gate tunneling leakage current component and the drain current (leakage component) due to BTB tunneling leakage are not negligible. In some device configurations, the BTB tunneling current is dominant at normal temperature and Vg=0V (in the off state) In this case, the drain current does not decrease even if the source voltage changes. Thus, the subthreshold leakage should only be reduced to the level of BTB tunneling current at high temperature, and a further change in the source voltage does not have the effect of reducing the leakage current.

The upper limit of the source voltage to be changed needs to be within the range of output logic voltage such as threshold voltage in order for the MOS transistor to operate normally.

The range of the source voltage to be changed, which is an upper limit for an NMOS transistor and a lower limit for a PMOS transistor, is determined by the following conditions:

1. Determine the source voltage so that device leakage current satisfies a given range, i.e. specification
2. Determine the source voltage so as to reduce drain current to the level of leakage current which is not dependent on temperature, i.e. BTB tunneling-leakage current
3. Determine the upper/lower limit of source voltage so that the logic level of a given circuit falls within the range of an appropriate value, i.e. a threshold value.

The upper limit is determined by the relationship of temperature-to-subthreshold (leakage current) characteristics and source voltage-to-subthreshold (leakage current) characteristics of MOS transistors.

The configuration of the voltage generator of this embodiment is described hereinafter with reference to FIG. 7. The voltage generator 111 has a current monitor 71, a voltage converter 72, a level detector 73, and a driver 74. The voltage generator 111 may have another configuration as long as it is capable of outputting the characteristics shown in FIG. 6.

The current monitor 71 monitors leakage current (drain current) which changes according to temperature. The current monitor 71 has a PMOS transistor (leakage current generator transistor) P71 which generates leakage current Ioff, NMOS transistors N71 and N72 which constitute a current mirror, and a PMOS transistor (leakage current output transistor) P72 which outputs the monitored leakage current Ioff.

The source and gate of the PMOS transistor P71 are connected to a power supply Vcc, not shown, and the drain is connected to the drain of the NMOS transistor N71. The source of the PMOS transistor P72 is connected to the power supply Vcc and the gate and the drain are connected to the drain of the NMOS transistor N72. The connection node of the gate and drain of the PMOS transistor P72 is an output terminal of the current monitor 71. The gate of the NMOS transistor N71 is connected to the drain of the NMOS transistor N71 and the gate of the NMOS transistor N72. The source of the NMOS transistor N71 is connected to GND. The source of the NMOS transistor N72 is also connected to GND.

The NMOS transistors N71 and N72 are preferably the same size, and the PMOS transistors P71 and P72 are also preferably the same size. However, these transistor pairs may be different size as long as they can generate desired voltage together with the voltage converter 72 or the like.

The voltage converter 72, the level detector 73, and the driver 74 serve as a voltage generator which generates source voltage (VOUT) from the current generated by the current monitor 71. The voltage converter 72 converts the input current into a desired voltage level. The voltage converter 72 has a PMOS transistor P73 and a resistor R1. The resistor R1 preferably has resistance which hardly changes by temperature. The PMOS transistor P73 may be the same size as or different size from the PMOS transistors P71 and P72 of the current monitor 71 as long as it can output a desired voltage level.

The source of the PMOS transistor P73 is connected to the power supply Vcc, the gate is connected to the output terminal of the current monitor 71, and the drain is connected to one end of the resistor R1. The drain of the PMOS transistor P73 is an output terminal of the voltage converter 72. The other end of the resistor R1 is connected to GND.

The level detector 73 detects the output level of the driver 74 in the subsequent stage and controls the output level of the driver 74 according to an input voltage level. The level detector 73 has an operational amplifier OPA1 which operates as a differential amplifier.

The inverting input terminal of the operational amplifier OPA1 is connected to the output terminal of the voltage converter 72, and the non-inverting input terminal is connected to an output terminal of the driver 74. The output terminal of the operational amplifier is an output terminal of the level detector 73.

The driver 74 amplifies input voltage and outputs VOUT, which is source voltage. The driver 74 has a PMOS transistor P74 which amplifies input voltage and a resistor R2 which determines bias of the operational amplifier OPA1.

The source of the PMOS transistor P74 is connected to the power supply Vcc, the gate is connected to the output terminal of the level detector 73, and the drain is connected to one end of the resistor R2. The drain of the PMOS transistor P74 is an output terminal. The other end of the resistor R2 is connected to GND.

Figure 8:
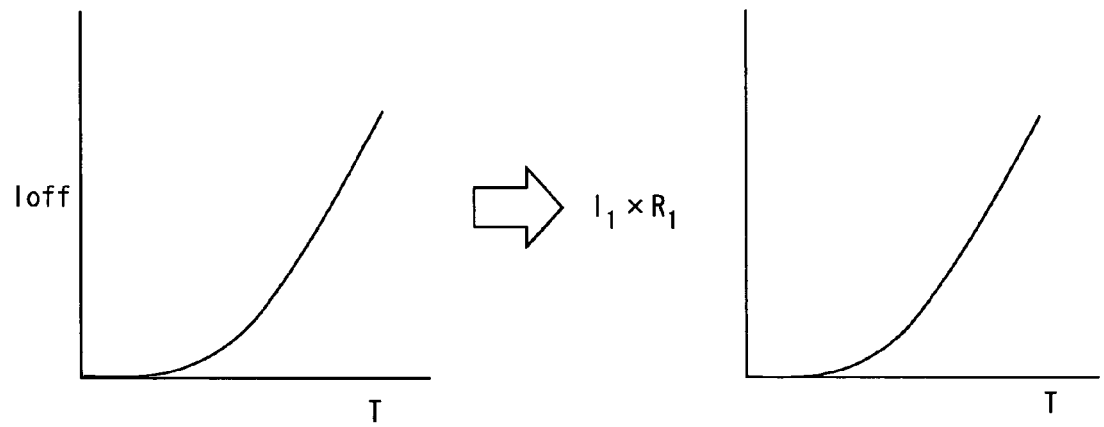
FIG. 8 is a graph showing the characteristics of a MOS transistor of the present invention.

In the current monitor 71, the PMOS transistor P71 is always in the off state, and leakage current Ioff flows therethrough. As shown in the graph at the left of FIG. 8, the leakage current Ioff changes exponentially with temperature. The leakage current Ioff flows into the NMOS transistor N71 and also into the NMOS transistor N72 which constitutes a current mirror together with the NMOS transistor N71. Since the PMOS transistors P71 and P72 are the same size, the same leakage current Ioff flows into the PMOS transistor P72 as well. Thus, the leakage current Ioff shown in the graph at the left of FIG. 8 is output from the current monitor 71.

In the voltage converter 72, since the PMOS transistor P73 constitutes a current mirror together with the PMOS transistor P72 of the current monitor 71, current I1 which corresponds to the size ratio of the PMOS transistors P72 and P73 flows into the PMOS transistor P73. For example, if the PMOS transistors P72 and P73 are the same size, the current I1 is the same value as the leakage current Ioff. Flowing into the resistor R1, the current I1 is converted into desired voltage (I1*R1) and output. Since the resistance of the resistor R1 does not change by temperature as shown in the graph at the right of FIG. 8, the output voltage (I1*R1) changes exponentially with temperature just like the leakage current Ioff.

In the level detector 73, the operational amplifier OPA1 compares reference voltage Vref, which is the output voltage (I1*R1) of the voltage converter 72, with output voltage VOUT of the driver 74. If the output voltage VOUT is lower than the reference voltage Vref, the operational amplifier OPA1 outputs lower voltage. If the output voltage VOUT is higher than the reference voltage Vref, the operational amplifier OPA1 outputs higher voltage.

In the driver 74, gate voltage of the PMOS transistor P74 is controlled by the operational amplifier OPA1 of the level detector 73, and current I2 which corresponds to the gate voltage flows therethrough. The current I2 then flows into the resistor R2, and thereby output voltage VOUT (I2*R2) is generated and output as source voltage. The output voltage VOUT changes exponentially with temperature as shown in FIG. 6.

Since an upper limit of the source voltage exists as shown in the graph of FIG. 6, the resistance of the resistor R1 is determined so that the voltage (I1*R1) does not exceed a given upper limit, considering the current I1 at the highest use temperature. Further, this embodiment allows the voltage to change exponentially from a given temperature as shown in FIG. 6 by monitoring the leakage current of the PMOS transistor.

As described in the foregoing, by continuously changing the source voltage of the MOS transistor according to temperature change in device, it is possible to reduce standby current with a small sacrifice in operation speed or access time. This embodiment implements control which optimizes the relationship of temperature and source voltage so that a change in the source voltage from substrate potential becomes larger as the temperature becomes higher in order to reduce the standby current. This improves the operation speed efficiently to reduce power consumption. Particularly, since it allows a change in the source voltage to be small at normal temperatures or the like, it is possible to increase the speed of operation when switching from standby to active. Further, since this embodiment determines the relationship between temperature and source voltage based on the temperature dependence of the leakage current in the MOS transistor and the relationship between source voltage and leakage current, a designer can determine the source voltage in an appropriate range.

Second Embodiment

Figure 9:
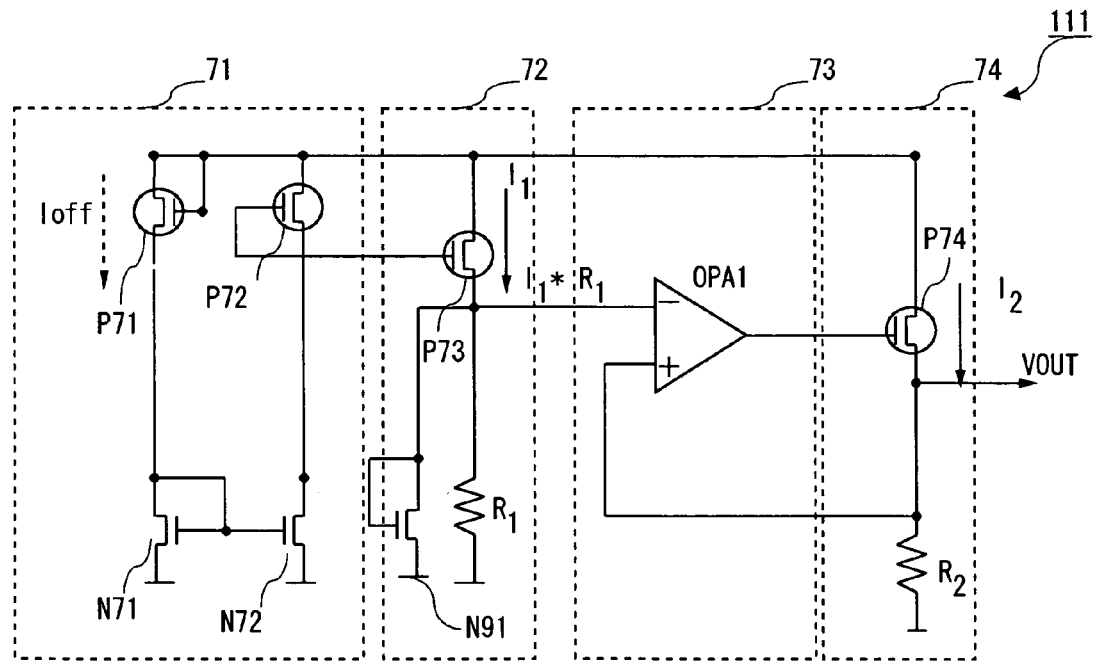
FIG. 9 is a circuit diagram showing the configuration of a voltage generator of the present invention.

The configuration of a voltage generator according to a second embodiment of the invention is described hereinafter with reference to FIG. 9. Like the circuit of FIG. 7, the voltage generator 111 is applicable to the source voltage controller 101 in FIGS. 1 to 3. In the voltage generator 111 of this embodiment, the voltage converter 72 further has an NMOS transistor N91 in addition to the elements shown in FIG. 7. The other elements are the same as in FIG. 7.

In the voltage converter 72, the NMOS transistor N91 is a clamping device which clamps the output voltage (I1*R1) of the voltage converter 72. The gate and drain of the NMOS transistor N91 are connected to the drain of the PMOS transistor P73 and the source is connected to GND.

Figure 7:
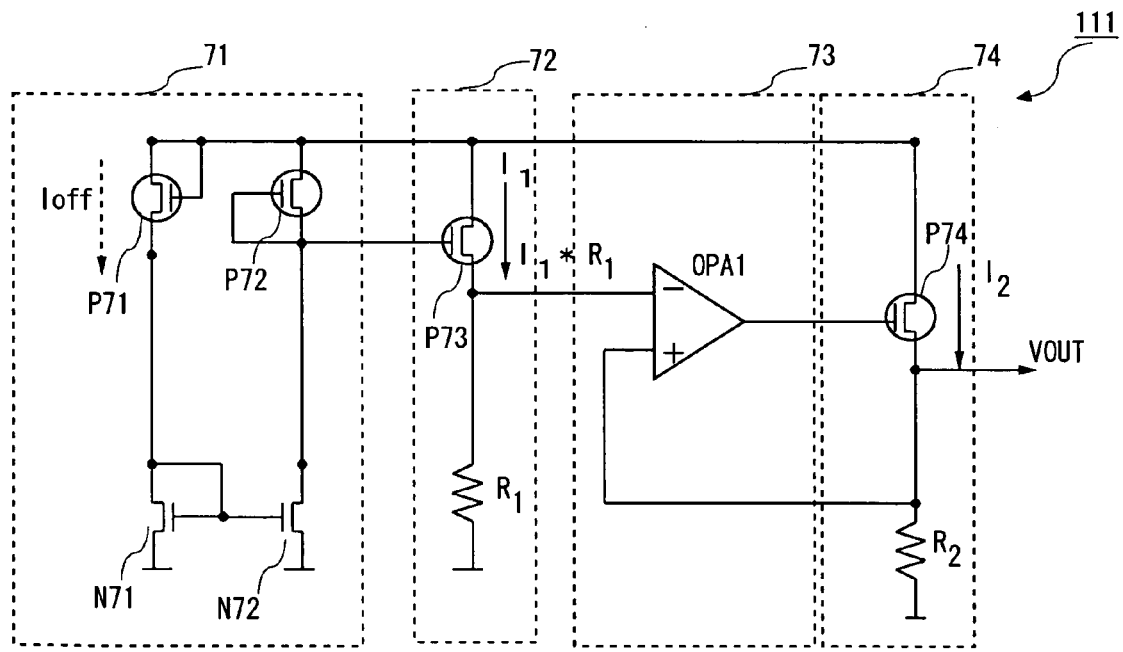
FIG. 7 is a circuit diagram showing the configuration of a voltage generator of the present invention.

The voltage converter 72 generates the output voltage (I1*R1) as in FIG. 7. Since the NMOS transistor N91 is in the off state until a given level, which is the threshold voltage of the NMOS transistor N91, is reached, the output voltage is input to the level detector 73. When the output voltage reaches the threshold voltage, the NMOS transistor N91 is turned on and the current I1 flows through the NMOS transistor N91 to GND, thereby reducing the output voltage. The output voltage of the voltage converter 72 is thus clamped to a given level.

In this way, placing the clamping device prevents the source voltage output from the voltage generator 111 from exceeding a given upper limit.

Third Embodiment

Figure 10:
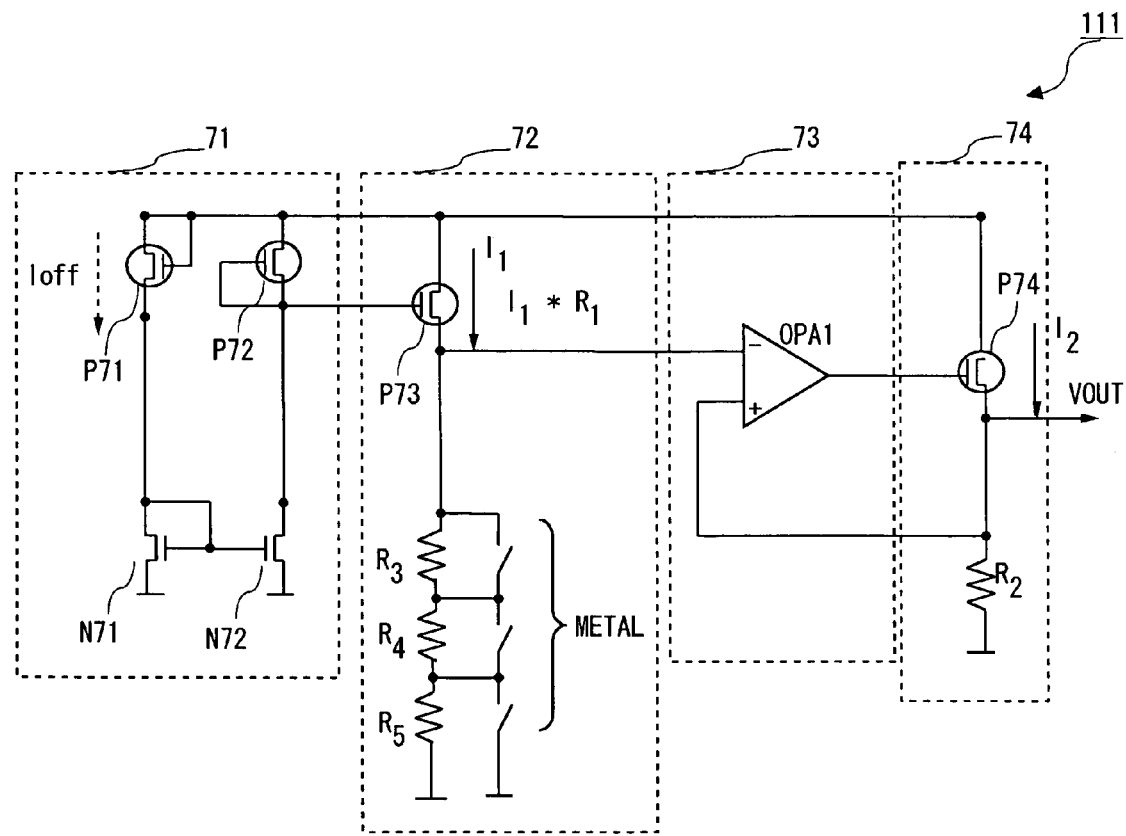
FIG. 10 is a circuit diagram showing the configuration of a voltage generator of the present invention.

The configuration of a voltage generator according to a third embodiment of the invention is described hereinafter with reference to FIG. 10. Like the circuit of FIG. 7, the voltage generator 111 is applicable to the source voltage controller 101 of FIGS. 1 to 3. In the voltage generator 111 of this embodiment, the resistance R1 in FIG. 7 is replaced with resistors R3, R4 and R5. The other elements are the same as in FIG. 7. Though three resistors are used in this example, an arbitrary number of resistors may be placed. More resistors allow more accurate adjustment of resistance.

In the voltage converter 72, the resistors R3, R4, and R5 determine the output voltage of the voltage converter 72. The resistors R3, R4, and R5 are connected in series. On end of the resistor R3 is connected to the drain of the PMOS transistor P73 and the other end of the resistor R3 is connected to one end of the resistor R4. On end of the resistor R5 is connected to the other end of the resistor R4, and the other end of the resistor R5 is connected to GND.

The resistors R3, R4, and R5 can be short-circuited by metal, and the resistor which is not short-circuited by metal is an effective resistor. In other words, resistance can be switched by metal. For example, if all the resistors are not short-circuited by metal, effective resistance R is a sum of the resistance of the resistors R3, R4, and R5. If the resistor R3 is short-circuited by metal, effective resistance R is a sum of the resistance of the resistors R4 and R5.

In the voltage converter 72, current I1 of the PMOS transistor P73 flows into the resistors R3, R4, and R5 which are not short-circuited by metal. The output voltage (I1*R) generated from the current I1 and the effective resistance R is thereby output.

The shape of the metal to short-circuit the resistor, which is the shape of a line layer, is determined by a mask used when manufacturing integrated circuit apparatus. It is therefore necessary to determine which resistor is to be short-circuited and change the layout of the mask. One way is to make a sample integrated circuit apparatus and measure the resistance with TEG or the like, thereby determining the resistor to be short-circuited.

By placing a plurality of resistors and making their resistance variable by metal, it is possible to adjust the source voltage output from the voltage generator 111. It is also possible to change the source voltage easily for each source voltage controller when a plurality of the source voltage controllers 101 are placed as in FIG. 1.

Fourth Embodiment

Figure 11:
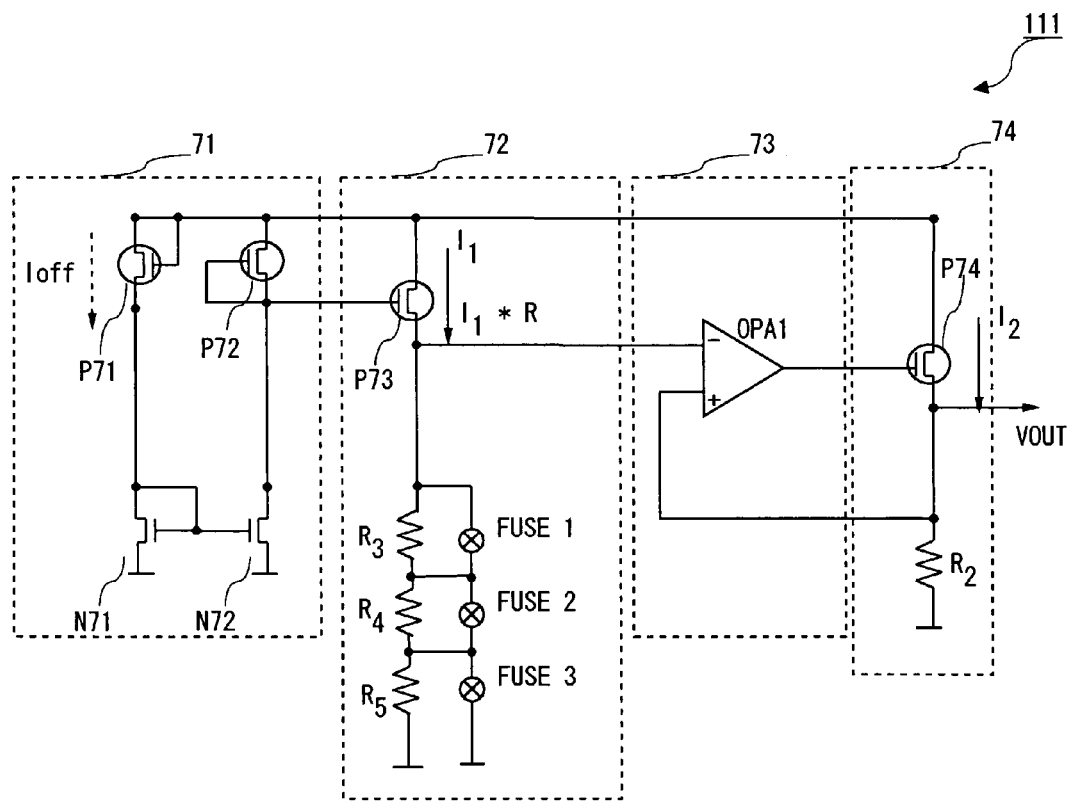
FIG. 11 is a circuit diagram showing the configuration of a voltage generator of the present invention.

The configuration of a voltage generator according to a fourth embodiment of the invention is described hereinafter with reference to FIG. 11. Like the circuit of FIG. 7, the voltage generator 111 is applicable to the source voltage controller 101 of FIGS. 1 to 3. The voltage generator 111 of this embodiment has the resistors R3, R4, and R5 just like in FIG. 10. In this embodiment, the resistors R3, R4, and R5 can be short-circuited by fuses Fuse1, Fuse2 and Fuse3, respectively, and the resistance can be switched by the fuses. The resistor where the fuse is cut and which is not short-circuited is an effective resistor. The fuse to short-circuit the resistor is cut by laser or the like after manufacturing integrated circuit apparatus. This embodiment is the same as the third embodiment shown in FIG. 10 except for the way of switching the resistance.

By placing a plurality of resistors and making their resistance variable by fuses, it is possible to adjust the source voltage output from the voltage generator 111. Since the resistance is switched by the fuses, a change can be made after manufacturing integrated circuit apparatus.

Fifth Embodiment

Figure 12:
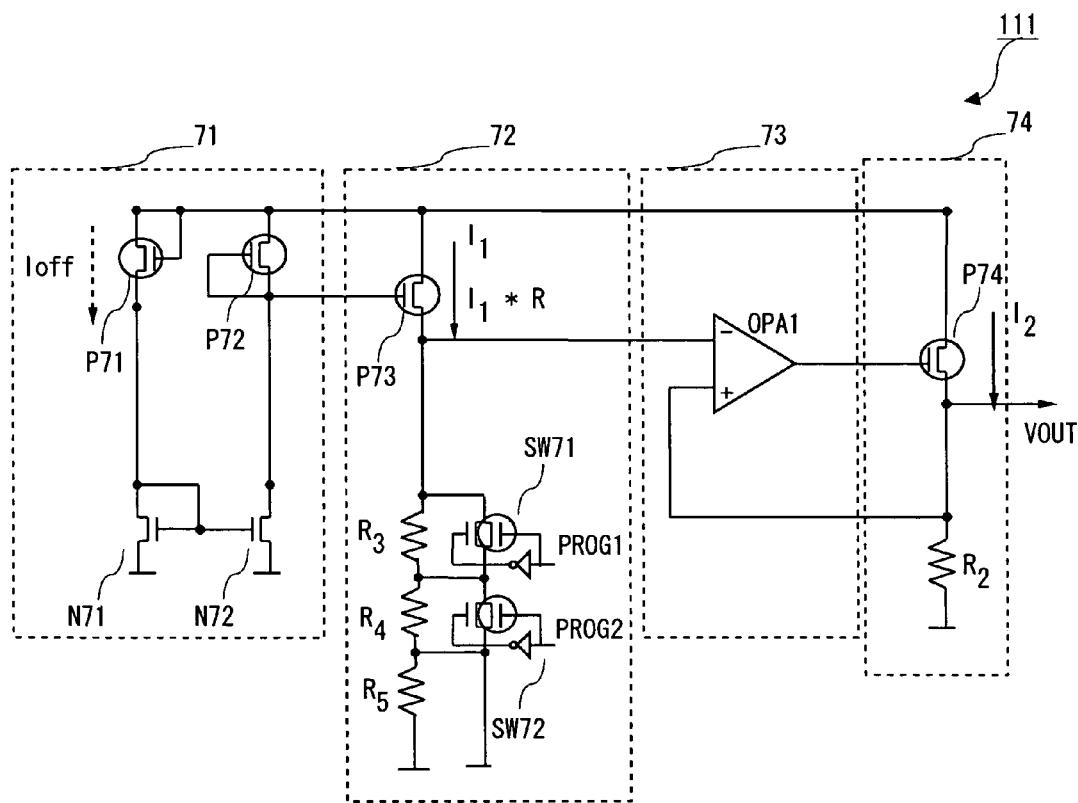
FIG. 12 is a circuit diagram showing the configuration of a voltage generator of the present invention.

The configuration of a voltage generator according to a fifth embodiment of the invention is described hereinafter with reference to FIG. 12. Like the circuit of FIG. 7, the voltage generator 111 is applicable to the source voltage controller 101 of FIGS. 1 to 3. The voltage generator 111 of this embodiment has the resistors R3, R4, and R5 just like the circuit of FIGS. 10 and 11. In this embodiment, the resistors R3 and R4 can be short-circuited by switches SW71 and SW72, respectively, and the resistance can be switched by the switches. Further, it is feasible to place a switch for the resistor R5 to short-circuit it. The switches SW71 and SW72 are transfer gates, for example, which are composed of a PMOS transistor, an NMOS transistor, and an inverter.

Of the resistors R3 and R4, the resistor where the switch SW71 or SW72 is off and which is not short-circuited is an effecter resistor. The switches SW71 and SW72 may be turned on and off by control signals Prog1 and Prog2 from a control circuit such as a program circuit, for example. This embodiment is the same as the above embodiments shown in FIGS. 10 and 11 except for the way of switching the resistance.

By placing a plurality of resistors and making their resistance variable by switches, it is possible to adjust the source voltage output from the voltage generator 111. Since the resistance is switched by the switches, a change can be made any number of times after manufacturing integrated circuit apparatus or even during the operation of the integrated circuit apparatus.

Other Embodiments

Although the above embodiments mainly describe the case of controlling the source voltage of an NMOS transistor of an inverter, the present invention is not limited thereto. It is feasible to control the source voltage of a PMOS transistor of an inverter or to control the source voltage of both or either of an NMOS transistor and a PMOS transistor of an inverter.

Figure 13:
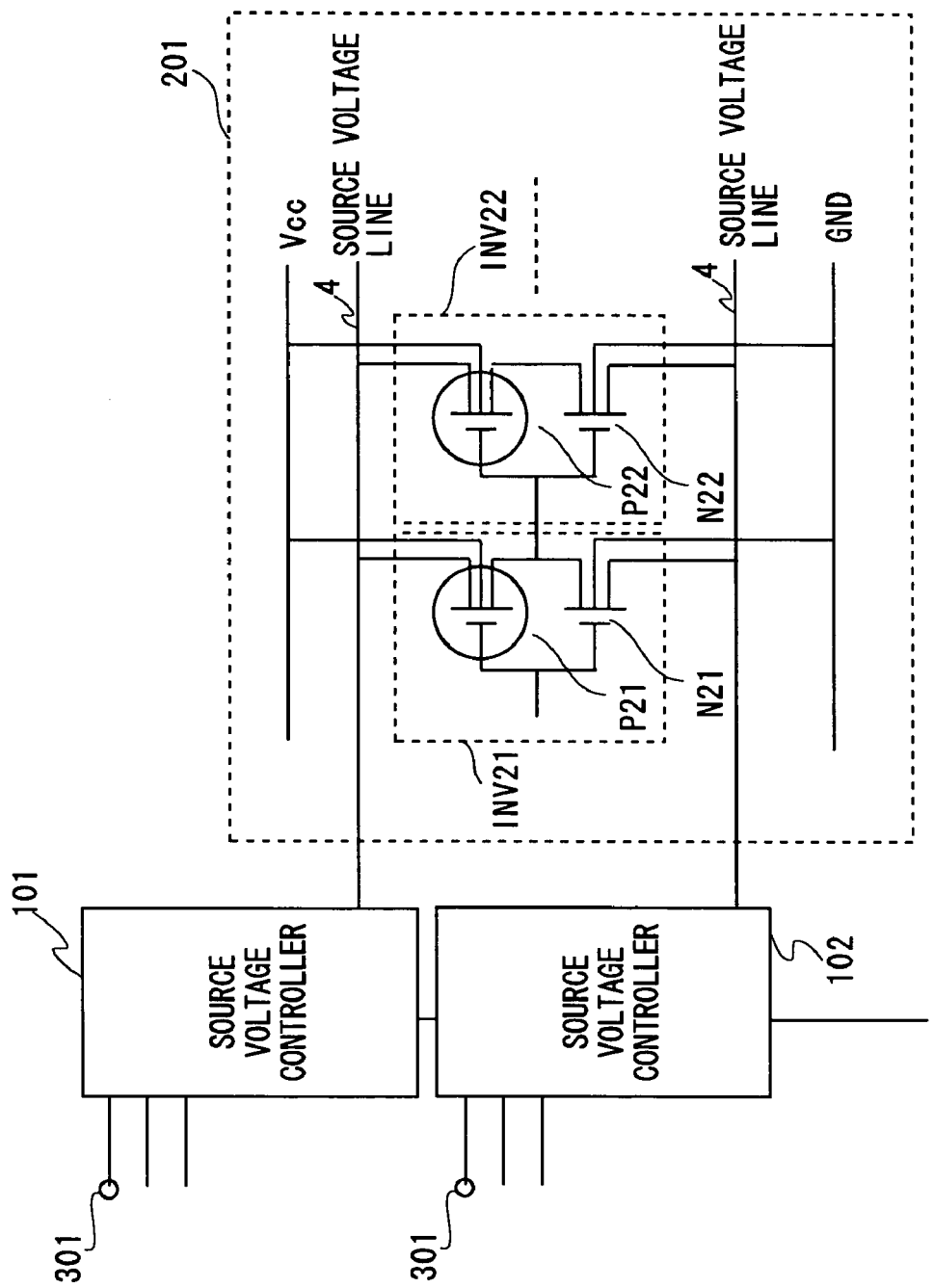
FIG. 13 is a block diagram of an internal circuit block of the present invention.

For example, in the example of FIG. 13, the sources of the PMOS transistors P21 and P22 are connected to the source voltage line 4 and their substrate terminals are connected to the power supply Vcc. The other elements are the same as in FIG. 2A. It is thereby possible to control the source voltage of both the PMOS transistor and the NMOS transistor. This has a higher effect than the case of controlling the source voltage of either transistor.

When controlling the source voltage of a PMOS transistor, the source voltage is reduced as temperature becomes higher, which is opposite to the case of an NMOS transistor. It is therefore necessary to configure the voltage generator 111 by replacing the power supply Vcc and GND with each other and the PMOS transistor and the NMOS transistor with each other.

Figure 14:
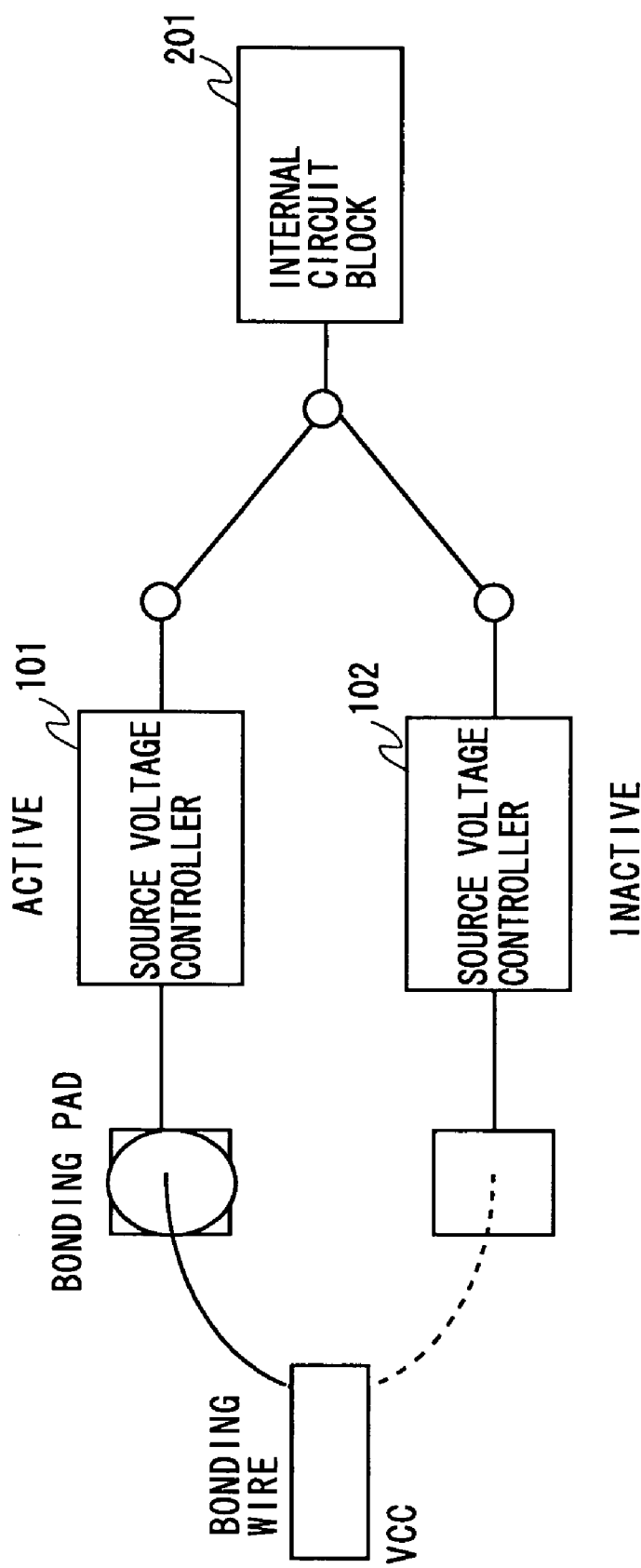
FIG. 14 is a block diagram of an integrated circuit apparatus of the present invention.

Further, though the above embodiments describe the case of switching the source voltage by the circuit configuration or the like of the voltage generator, the present invention is not restricted thereto. The source voltage may be switched by changing the connection between the internal circuit block 201 and the source voltage controller 101 or the connection between the source voltage controller 101 and the power supply Vcc. For instance, in the example of FIG. 14, the internal circuit block 201 is connected to both the source voltage controllers 101 and 102, and either one of the source voltage controller 101 and 102 is connected to the power supply Vcc through a bonding pad and a bonding wire. This configuration switches the source voltage controllers 101 and 102 between active and inactive by changing the connection of the bonding wire. In this example, the source voltage controller 101 to which the bonding wire is connected is active, and the source voltage is output from the source voltage controller 101 to the internal circuit block 201. In this case, it is necessary to determine desired source voltage before assembling integrated circuit apparatus.

It is apparent that the present invention is not limited to the above embodiment that may be modified and changed without departing from the scope and spirit of the invention.

What is claimed is:

1. An integrated circuit apparatus comprising:
   a MOSFET; and
   a source voltage controller controlling source voltage of the MOSFET according to an operation mode of the MOSFET and changing the source voltage based on temperature,
   wherein the source voltage controller keeps the source voltage at a constant level if temperature is a predetermined value or lower, and changes the source voltage based on temperature change if the temperature is over the predetermined value.

2. The integrated circuit apparatus of claim 1, wherein the source voltage controller determines the source voltage based on characteristics of leakage current of the MOSFET with respect to temperature and characteristics of leakage current of the MOSFET with respect to source voltage of the MOSFET.

3. The integrated circuit apparatus of claim 1, wherein the source voltage controller continuously changes the source voltage when operation mode of the MOSFET is standby.

4. The integrated circuit apparatus of claim 1, further comprising:
   a first circuit block and a second circuit block;
   a first source voltage controller controlling source voltage of a MOSFET of the first circuit block; and
   a second source voltage controller controlling source voltage of a MOSFET of the second circuit block,
   wherein the source voltage controlled by the first source voltage controller and the source voltage controlled by the second source voltage controller are different from each other.

5. The integrated circuit apparatus of claim 4, wherein
the first circuit block is connected to the first and the second source voltage controllers, and
the integrated circuit apparatus further comprises a switching section switching the first and the second source voltage controllers between active and inactive.

6. The integrated circuit apparatus of claim 1, wherein the source voltage controller changes the source voltage within a range from a substrate potential or well potential level to a threshold voltage level of the MOSFET.

7. An integrated circuit apparatus of claim 1, wherein the source voltage controller changes the source voltage within a range from a substrate potential or well potential level to a voltage level where drain current becomes the same as temperature independent leakage current component.

8. The integrated circuit apparatus of claim 1, wherein the source voltage controller changes the source voltage within a range from a substrate potential or well potential level to a voltage level where drain current becomes a predetermined value or lower at an upper limit of use temperature of the integrated circuit apparatus.

9. The integrated circuit apparatus of claim 1, wherein the source voltage controller comprises:
a current monitor monitoring leakage current flowing according to temperature and generating current based on the leakage current; and
a voltage generator generating the source voltage from the current generated by the current monitor,
wherein the voltage generator has a resistor whose resistance is temperature independent or a resistor with temperature dependence which is negligible compared to temperature dependence of leakage current, and generates the source voltage using the current generated by the current monitor and the resistance of the resistor.

10. The integrated circuit apparatus of claim 9, wherein the voltage generator further comprises a clamp circuit clamping the source voltage at a predetermined voltage.

11. The integrated circuit apparatus of claim 9, wherein the voltage generator comprises a plurality of resistors each of which has temperature independent resistance or has temperature dependence which is negligible compared to temperature dependence of leakage current, for changing the source voltage by switching between the plurality of resistors.

12. The integrated circuit apparatus of claim 11, wherein the plurality of resistors are connected in series, and
the plurality of resistors are switched by changing layout of a mask to form a line layer of the integrated circuit apparatus connecting ends of resistors selected form the plurality of resistors for short-circuit.

13. The integrated circuit apparatus of claim 11, wherein the plurality of resistors are connected in series,
the voltage generator comprises a plurality of fuses connecting both ends of each of the plurality of resistors for short-circuit, and
the plurality of resistors are switched by cutting a fuse selected from the plurality of fuses.

14. The integrated circuit apparatus of claim 11, wherein the plurality of resistors are connected in series,
the voltage generator comprises a plurality of switches connecting both ends of each of the plurality of resistors for short-circuit, and
the plurality of resistors are switched by turning on and off a switch selected from the plurality of switches.

15. The integrated circuit apparatus of claim 11, wherein the current monitor comprises:

a leakage current generation transistor having a source and a gate shod-circuited to each other and generating leakage current;
a current mirror circuit generating current according to leakage current flowing through a monitor transistor; and
a leakage current output transistor having a gate and a drain shod-circuited to each other and outputting the current generated by the current mirror circuit.

16. The integrated circuit apparatus of claim 1, wherein the MOSFET is a driver device of a SRAM cell.

17. An integrated circuit comprising:
a MOSFET; and
a source voltage controller controlling source voltage of the MOSFET according to an operation mode of the MOSFET and changing the source voltage based on temperature,
wherein the source voltage controller changes the source voltage exponentially according to temperature.

18. The integrated circuit apparatus of claim 17, wherein the source voltage controller continuously changes the source voltage when operation mode of the MOSFET is standby.

19. The integrated circuit apparatus of claim 17, wherein the source voltage controller changes the source voltage within a range from a substrate potential or well potential level to a threshold voltage level of the MOSFET.

20. An integrated circuit apparatus of claim 17, wherein the source voltage controller changes the source voltage within a range from a substrate potential or well potential level to a voltage level where drain current becomes the same as temperature independent leakage current component.

21. The integrated circuit apparatus of claim 17, wherein the source voltage controller changes the source voltage within a range from a substrate potential or well potential level to a voltage level where drain current becomes a predetermined value or lower at an upper limit of use temperature of the integrated circuit apparatus.

22. The integrated circuit apparatus of claim 17, wherein the source voltage controller comprises:
a current monitor monitoring leakage current flowing according to temperature and generating current based on the leakage current; and
a voltage generator generating the source voltage from the current generated by the current monitor,
wherein the voltage generator has a resistor whose resistance is temperature independent or a resistor with temperature dependence which is negligible compared to temperature dependence of leakage current, and generates the source voltage using the current generated by the current monitor and the resistance of the resistor.

23. The integrated circuit apparatus of claim 22, wherein the voltage generator circuit comprises:
a voltage converter having the resistor and converting the current generated by the current monitor into voltage;
a level detector detecting levels of the voltage converted by the voltage converter and the source voltage, and outputting a control signal according to voltage difference between the converted voltage and the source voltage; and
a driver generating the source voltage according to the control signal from the level detector.

24. An integrated circuit apparatus, comprising:
a MOSFET; and a source voltage controller controlling source voltage of the MOSFET according to an operation mode of the MOSFET and changing the source voltage based on temperature, wherein the source voltage controller keeps the source voltage at a constant level if temperature is a predetermined value or lower, and changes the source voltage based on temperature change if the temperature is over the predetermined value;

wherein the source voltage controller comprises:
 a current monitor monitoring leakage current flowing according to temperature and generating current based on the leakage current; and
 a voltage generator generating the source voltage from the current generated by the current monitor,
 wherein the voltage generator has a resistor whose resistance is temperature independent or a resistor with temperature dependence which is negligible compared to temperature dependence of leakage current, and generates the source voltage using the current generated by the current monitor and the resistance of the resistor; and wherein the voltage generator circuit comprises:
 a voltage converter having the resistor and converting the current generated by the current monitor into voltage;
 a level detector detecting levels of the voltage converted by the voltage converter and the source voltage, and outputting a control signal according to voltage difference between the converted voltage and the source voltage; and
 a driver generating the source voltage according to the control signal from the level detector.

25. The integrated circuit apparatus of claim 24, wherein the source voltage controller continuously changes the source voltage when operation mode of the MOSFET is standby.

26. The integrated circuit apparatus of claim 24, wherein the source voltage controller changes the source voltage within a range from a substrate potential or well potential level to a threshold voltage level of the MOSFET.

27. An integrated circuit apparatus of claim 24, wherein the source voltage controller changes the source voltage within a range from a substrate potential or well potential level to a voltage level where drain current becomes the same as temperature independent leakage current component.

28. The integrated circuit apparatus of claim 24, wherein the source voltage controller changes the source voltage within a range from a substrate potential or well potential level to a voltage level where drain current becomes a predetermined value or lower at an upper limit of use temperature of the integrated circuit apparatus.

* * * * *